United States Patent [19]

Matveev et al.

[11] 4,141,777

[45] Feb. 27, 1979

[54] METHOD OF PREPARING DOPED SINGLE CRYSTALS OF CADMIUM TELLURIDE

[76] Inventors: Oleg A. Matveev, prospekt Morisa Toreza, 9, kv. 101; Samuil V. Prokofiev, ulitsa S. Perovskoi, 14, kv. 29, both of Leningrad, U.S.S.R.

[21] Appl. No.: 593,975

[22] Filed: Jul. 8, 1975

[30] Foreign Application Priority Data

Jul. 19, 1974 [SU]  U.S.S.R. ................. 2047421

[51] Int. Cl.$^2$ ............... B01J 17/26; B01J 17/36; C01G 11/00
[52] U.S. Cl. ................. 156/606; 156/609; 156/611; 156/616 R; 156/DIG. 72; 252/62.3 ZT; 423/509
[58] Field of Search .......... 156/605, 606, 610, 611, 156/613, 614, 616, DIG. 72, 616 A, 616 R; 252/301.6R, 62.3 ZT; 423/508, 509, 99

[56] References Cited

U.S. PATENT DOCUMENTS

| | | | |
|---|---|---|---|
| 2,858,275 | 10/1958 | Folberth | 252/62.3 GA |
| 2,944,975 | 7/1960 | Folberth | 156/605 X |
| 3,366,454 | 1/1968 | Folberth et al. | 156/616 A X |

FOREIGN PATENT DOCUMENTS 1129789  10/1968  United Kingdom ............ 423/509

OTHER PUBLICATIONS

Lorenz, "Preparation of CdTe Crystals from Near Stoichiometric and Cd Rich Melt Compositions Under Constant Cd Pressure," J. Applied Physics, vol. 33, No. 11, pp. 3304–3306, (Nov. 1962).

*Primary Examiner*—Stephen J. Emery
*Attorney, Agent, or Firm*—Steinberg & Blake

[57] ABSTRACT

A method of preparing doped single crystals of cadmium telluride in a single ampoule accommodating a graphite container provided with an opening.

Cadmium and a dopant are directly placed in the ampoule, and tellurium is placed in the graphite container. The ampoule is heated at a temperature at which cadmium vapors are formed to penetrate through the opening, together with vapors of the dopant, into the graphite container wherein they react with tellurium vapors and melt to form cadmium telluride. As the temperature grows higher, cadmium telluride is converted into melt which is then subjected to directive crystallization. The resulting crystal is cooled at a rate not exceeding 15° per hour.

The crystals thus obtained have the following properties:

Lifetime of electron-hole combination $\tau$ — up to $3 \times 10^{-6}$ s;
Electric resistivity $\rho$ — up to $10^{10}$ Ohm. cm
Concentration of charge carriers less than $10^8$ cm$^{-3}$.

This invention can be used in the manufacture of gamma ray detectors, IR-radiation modulators and $CO_2$ laser windows.

1 Claim, No Drawings

METHOD OF PREPARING DOPED SINGLE CRYSTALS OF CADMIUM TELLURIDE

The present invention relates to the production of semiconductor materials, and more specifically to a method of producing doped single crystals of cadmium telluride.

Single crystals of cadmium telluride are of black colour, with electric resistivity of $10 - 10^8$ Ohm.cm, concentration of charge carriers of $10^9 - 10^{17}$ cm$^{-3}$ and lifetime of electron-hole combination less than $10^{-7}$ s. They are used in gamma ray detectors, IR-radiation modulators and windows of $CO_2$ lasers.

It is a common knowledge to obtain single crystals of cadmium telluride by growing single crystals from a melt solution (so-called travelling heater method THM) with doping of the melt solution with halogens or with elements of group III of the Periodic system, in particular with chlorine and indium.

This known method comprises passing a zone of liquid tellurim through a polycrystalline cadmium telluride ingot placed in temperature gradient zone. Though this method permits the preparation of crystals with a high resistance which may be used for making spectrometers, it has a number of disadvantages:

1. Very low crystal growth rates (about 0.5 cm/day).
2. Limited diameter of crystals.
3. Contact of the crystals being grown with the quartz ampoule resulting in contamination of the crystal thus obtained.
4. Need for a preliminarily synthesized cadmium telluride.
5. Complicated structure and high cost of a precision mechanism for lowering the ampoule in the temperature gradient zone.
6. Complicated and labour-consuming preparation of the ampoule involving a large number of steps.

It is known to prepare single crystals of cadmium telluride by the method of directive crystallization of cadmium telluride in a graphite boat placed, together with an excess of cadmium, in an evacuated and soldered quartz ampoule. For carrying out this method, elementary cadmium and tellurium are melted together beforehand in an evacuated and soldered quartz ampoule to obtain cadmium telluride compound. Then this compound is transferred into a graphite boat which is placed into a prepared ampoule. An excess quantity of cadmium is placed in the ampoule, which is required to produce an excess pressure of cadmium vapours controlled by varying the temperature of the "cold" end of the ampoule. Then the ampoule is evacuated, soldered and placed in a furnace of an apparatus for directive crystallization. After the furnace has been put under conditions for melting of the starting cadmium telluride, the boat with cadmium telluride is slowly cooled beginning with the end portion thereof. This method has the following disadvantages:

1. Need for a preliminary synthesized cadmium telluride.

Preliminary synthesis of the compound from the elements is carried out in quartz ampoules resulting in a heavy contamination of starting products with quartz impurities, as well as with silicon and oxygen. Furthermore, subsequent transferring of cadmium telluride from the quartz ampoule into the graphite boat and numerous production steps associated therewith also result in contamination of starting product, considerably increase the time required and complicate the method of preparing single crystals.

2. Single crystals of cadmium telluride obtained by the known method do not have sufficiently long lifetime of electron-hole combination so that they cannot be used for manufacturing gamma ray spectrometers which are in great demand.

In view of the above-mentioned considerable disadvantages, primarily the latter disadvantage, no detectors of gamma rays have been so far made on the basis of cadmium telluride obtained by the method of directive crystallization.

It is an object of the invention to provide a method of preparing doped single crystals of cadmium telluride, which ensures a shorter crystal growth time, larger crystal size and improved purity of crystals, while retaining a long lifetime of electron-hole combination.

This object is accomplished in a method of preparing doped cadmium telluride single crystals comprising, according to the invention, synthesizing and crystallizing cadmium telluride in a single ampoule, wherein the method comprises placing tellurium in a graphite container provided with an opening at the top portion thereof, inserting the container into a quartz ampoule containing cadmium and a dopant of group III or group VII of the Periodic system, the quantity of cadmium in the ampoule exceeding that stoichiometrically required for the synthesis of cadmium telluride; evacuating the ampoule, soldering it and heating at a temperature sufficient for the formation of vapours of cadmium and the dopant in the ampoule and for melting of tellurium in the graphite container, whereby, as the temperature increases the resulting cadmium vapours having a much greater tension than tellurium vapours rapidly penetrate through said opening, together with vapours of the dopant, into the inner space of the graphite container wherein they react with vapours and melt of tellurium to form doped cadmium telluride which is melted and converted into liquid phase at the melting point of cadmium telluride, and subjecting the liquid phase to directive crystallization at a pressure of vapours of excess cadmium of from 0.5 to 2 atm with subsequent cooling of the ampoule containing the resulting crystal at a rate not exceeding 15 degrees per hour.

The dopant may comprise elements of groups III and VII of the Periodic system, the best properties of cadmium telluride single crystals being obtained when doping with chlorine.

The invention ensures:

1. An increase in the lifetime of electron-hole combination up to $3 \times 10^{-6}$ s, electric resistivity of cadmium telluride up to $10^{10}$ Ohm.cm, and a decrease in concentration of charge carriers to $10^7$ cm$^{-3}$.
2. Provision of gamma ray spectrometers with resolution better than 2% with $Cs^{137}$.
3. Growth of considerably larger single crystals (up to $2 \times 3 \times 12$ cm$^3$) as compared to the method of crystallization from melt solution THM and in a shorter time (about 120 hours).
4. Elimination of the entire group of steps associated with the preliminary synthesis of cadmium telluride.

These and other advantages of the invention will be apparent from the following detailed description thereof. The container comprises a graphite boat having a cover of the same highly pure graphite, the cover having one or several openings in the end walls for free vapour exchange of the inner space of the container with the ampoule space. In another example, the container may comprise a graphite cylinder tightly sealed with a cover having an opening. The cylinder is placed in the ampoule in a horizontal position in such a manner that the opening should be at the top.

The graphite boat containing tellurium is placed in a quartz ampoule, and cadmium is placed in the ampoule near the boat. The cadmium quantity is in excess of the stoichiometric quantity required for the synthesis of cadmium telluride. This extra quantity is required to create a predetermined pressure in the ampoule. Dopant in the form of cadmium chloride is placed in the ampoule. Where low-volatile dopants such as aluminium are used, the dopant is placed directly in the graphite boat together with tellurium.

After evacuation and soldering of the ampoule, it is placed into a furnace of an apparatus for directive crystallization, and the synthesis is carried out by rapidly raising the temperature in the reaction space up to 1100° C (in about 2 hours). Cadmium vapours thus formed penetrate, together with the vapours of the dopant, into the container to react therein with tellurium and to form cadmium telluride. That part of the tellurium which was initially sublimed and deposited onto the inner walls of the container during the heating would also react with cadmium to form cadmium telluride and fall in the form of droplets at the melting point of cadmium telluride at 1092° C. Molten cadmium telluride is crystallized by the directive crystallization method at a pressure of cadmium vapours from 0.5 to 2 atm at a rate of 0.5 cm per hour.

On completion of the crystallization process, the ampoule is slowly cooled from 1092° C to 150° C at a rate not exceeding 15° per hour. During the cooling, electrically active lattice defects and extraneous impurities react with chlorine atoms to form electrically inactive cmplexes, thereby materially increasing the lifetime of electron-hole combinations in the resulting single crystals, and the electric resistivity of the crystals approximates the resistivity of cadmium telluride proper. It should be noted that concentration of charge carriers is materially lowered.

Thus, crystals having the following properties have been obtained:

Lifetime of electron-hole combination $3 \times 10^6$ s
Electric resistivity $10^{10}$ Ohm.cm
Concentration of charge carriers less than $10^8$ cm$^{-3}$
Crystal volume up to 72 cm$^3$ These single crystals were used for making gamma ray detectors of the following types:
 (a) spectrometric detectors with resolution better than 2% with Cs$^{137}$ with a volume of 25 mm$^3$;
 (b) count detectors with a volume greater than 0.5 cm$^3$.

Furthermore, the resulting single crystals are suitable for making IR-radiation modulators for a wavelength of 10.6 m and windows of high-power CO$_2$ lasers.

The above properties of crystals were obtained due to the synthesis and directive crystallization of cadmium telluride conducted in a single ampoule and with a single sequence of production steps.

EXAMPLE 1

712.11 g of tellurium of 99.999% purity were placed in a 300 cm$^3$ graphite container provided with an opening of 8 mm diameter at the top. The container was placed in a 900 cm$^3$ quartz ampoule, and 629.7 g of cadmium of 99.999% purity and 0.1 g of cadmium chloride were placed in the ampoule. The ampoule was evacuated to a residual pressure of $10^{-6}$ mm Hg and sealed off. Then the ampoule with the container was placed in a furnace of an apparatus for directive crystallization, and synthesis was conducted. For that purpose, heating was performed at 600°–700° C., the resulting cadmium vapours which had a much greater tension than tellurium vapours penetrated through the opening, together with the dopant vapours, into the graphite container to react therein with the vapours and melt of tellurium. The reaction of cadmium and tellurium was completed at about 1000° C., and at 1092° C., cadmium telluride was converted into liquid phase. The whole process of synthesis lasted two hours.

Subsequently, after allowing the melt to stay for 3 hours at 1100° C. for homogenation, the process of directive crystallization was started at a crystal growth rate of about 0.5 cm per hour and at a pressure of cadmium vapours of about 1 atm.

On completion of the crystallization process the ampoule was cooled from 1092° C. to 150° C. at a rate of 15° per hour.

As a result, crystals were obtained having an electric resistivity $\rho = 2 \times 10^9 - 1 \times 10^{10}$ Ohm.cm, lifetime of electron-combination $\tau = 1 \times 10^{-6} - 3 \times 10^{-6}$ s and concentration of free charge carriers of $7 \times 10^7$ cm$^{-3}$.

These crystals were used in making detectors of gamma rays with a resolution better than 2% with Cs$^{137}$.

EXAMPLE 2

The process was conducted similarly to that described in Example 1, but the dopant charged into the ampoule comprised cadmium bromide CdBr$_2$, and the rate of cooling of the ampoule from 1092° C. to 150° C. was 10° per hour.

As a result, crystals were obtained having electric resistivity $\rho = 3 \times 10^9 - 1 \times 10^{10}$ Ohm.cm and lifetime of electron-hole combination $\tau = 9 \times 10^{-7} - 1 \times 10^{-6}$ s.

EXAMPLE 3

The process was conducted as described in Example 1, but the dopant charged into the container comprised indium in an amount of 0.1 g. Ampoule cooling rate was 12° per hour.

The resulting crystals has electric resistivity $\rho = 7 \times 10^8 - 5 \times 10^9$ Ohm.cm and $\tau = 7 \times 10^{-7} - 2 \times 10^{-6}$ s.

EXAMPLE 4

The process was conducted as described in Example 1, but the quantity of the dopant CdCl$_2$, was reduced to 0.05 g. The resulting crystals had the following properties: $\rho = 2 \times 10^9 - 1 \times 10^{10}$ Ohm.cm and $\tau = 1 \times 10^{-6} - 3 \times 10^{-6}$ s.

What is claimed is:
1. Method of preparing doped single crystals of cadmium telluride, which comprises placing tellurium in a graphite container provided with an opening at the top thereof, inserting the container into a quartz ampoule containing cadmium and a chlorine doping element, the quantity of cadmium in the ampoule exceeding that stoichiometrically required for the synthesis of cadmium telluride, evacuating the ampoule, sealing the same and heating at a temperature sufficient for the formation of vapours of cadmium and of the doping element in the ampoule and for the melting of tellurium in the graphite container, whereby as the temperature increases the resulting cadmium vapours penetrate through said opening together with vapours of the dop- ing element and into the inner space of the graphite container to react therein with the vapours and melt of tellurium, thus forming doped cadmium telluride which is converted into liquid phase at the melting point thereof, and subjecting said doped cadmium telluride to directive crystallization at a partial pressure of the vapours of the excess cadmium of from 0.5 to 2 atm with subsequent cooling of the ampoule containing the resulting crystal at a rate not exceeding 15° per hour whereby the resulting crystal has a chlorine doping concentration of $10^{15}$ to $10^{20}$ atoms per cubic centimeter.

* * * * *